(12) United States Patent
Kaneko et al.

(10) Patent No.: US 10,741,223 B2
(45) Date of Patent: Aug. 11, 2020

(54) SEALED BULKHEAD ELECTRICAL FEED-THROUGH POSITIONING CONTROL

(71) Applicant: Western Digital Technologies, Inc., San Jose, CA (US)

(72) Inventors: Jiro Kaneko, Yokohama (JP); Yuta Onobu, Yokohama (JP)

(73) Assignee: Western Digital Technologies, Inc., San Jose, CA (US)

( * ) Notice: Subject to any disclaimer, the term of this patent is extended or adjusted under 35 U.S.C. 154(b) by 346 days.

(21) Appl. No.: 15/174,906

(22) Filed: Jun. 6, 2016

(65) Prior Publication Data
US 2017/0352386 A1 Dec. 7, 2017

(51) Int. Cl.
| | | |
|---|---|---|
| *G11B 33/12* | (2006.01) | |
| *H05K 5/02* | (2006.01) | |
| *G11B 33/14* | (2006.01) | |
| *H05K 5/06* | (2006.01) | |
| *G11B 33/02* | (2006.01) | |

(52) U.S. Cl.
CPC .......... *G11B 33/122* (2013.01); *G11B 33/022* (2013.01); *G11B 33/1446* (2013.01); *G11B 33/1466* (2013.01); *H05K 5/0247* (2013.01); *H05K 5/067* (2013.01)

(58) Field of Classification Search
CPC . G11B 33/122; G11B 33/022; G11B 33/1446; G11B 33/1466; H05K 5/0247; H05K 5/067
See application file for complete search history.

(56) References Cited

U.S. PATENT DOCUMENTS

| | | | | |
|---|---|---|---|---|
| 4,884,335 A | * | 12/1989 | McCoy | .............. H05K 3/34 29/839 |
| 5,257,941 A | | 11/1993 | Lwee et al. | |
| 5,357,386 A | | 10/1994 | Haidari et al. | |
| (Continued) | | | | |

FOREIGN PATENT DOCUMENTS

CN 203521728 U 4/2014

OTHER PUBLICATIONS

Patrick Courtney, Joining metal with adhesives, The Fabricator, Jan. 9, 2007, 4 pages, Fabricators & Manufacturers Association, Intl., downloaded from https://www.thefabricator.com/article/assembly/joining-metal-with-adhesives.

*Primary Examiner* — Jayprakash N Gandhi
*Assistant Examiner* — Michael A Matey
(74) *Attorney, Agent, or Firm* — Barry IP Law, P.C.

(57) ABSTRACT

An electrical feed-through, such as a PCB connector, involves at least one positioning protrusion protruding from a main body, and may further include multiple positioning protrusions protruding in respective directions from the main body. A data storage device employing such a feed-through comprises an enclosure base with which the feed-through is coupled, where the base comprises an annular recessed surface surrounding an aperture that is encompassed by the feed-through and is at a first level, and at least one recessed positioning surface at a higher level than the first level and extending in a direction away from the annular recessed surface. The positioning protrusion of the electrical feed-through physically mates with the recessed positioning surface of the base, such that the position of the feed-through is vertically constrained by the recessed positioning surface.

11 Claims, 5 Drawing Sheets

(56) References Cited

U.S. PATENT DOCUMENTS

| | | | |
|---|---|---|---|
| 5,454,157 A | 10/1995 | Ananth et al. | |
| 5,782,657 A * | 7/1998 | Wolla | H01R 13/4362 439/595 |
| 6,537,083 B1 | 3/2003 | Yatskov et al. | |
| 6,655,998 B1 * | 12/2003 | Kurimoto | H01R 13/4362 439/595 |
| 6,721,135 B2 | 4/2004 | Hong et al. | |
| 6,970,322 B2 | 11/2005 | Bernett | |
| 7,035,076 B1 * | 4/2006 | Stevenson | H01G 4/35 361/302 |
| 7,137,196 B2 | 11/2006 | Gunderson et al. | |
| 7,187,535 B1 * | 3/2007 | Iyer | A61N 1/3754 361/302 |
| 7,476,124 B2 | 1/2009 | Mewes et al. | |
| 7,581,989 B1 * | 9/2009 | Wheatley | H01R 13/5219 439/272 |
| 7,599,147 B2 * | 10/2009 | Gunderson | H05K 5/069 360/97.22 |
| 7,872,836 B2 | 1/2011 | Shindo et al. | |
| 7,874,846 B2 | 1/2011 | Gunderson et al. | |
| 7,876,527 B2 | 1/2011 | Nakamiya et al. | |
| 7,952,879 B1 | 5/2011 | Vinciarelli et al. | |
| 8,007,327 B2 | 8/2011 | Yang et al. | |
| 8,059,364 B1 | 11/2011 | Andrikowich et al. | |
| 8,179,631 B2 | 5/2012 | Aoyagi et al. | |
| 8,487,187 B2 | 7/2013 | VandenEynden et al. | |
| 8,536,468 B2 * | 9/2013 | Teske | A61N 1/3754 174/152 GM |
| 8,749,914 B2 | 6/2014 | Otake et al. | |
| 8,869,385 B2 | 10/2014 | Chang et al. | |
| 9,230,598 B1 | 1/2016 | Bernett et al. | |
| 9,458,936 B2 | 10/2016 | Bernett et al. | |
| 9,660,374 B2 * | 5/2017 | Baudelocque | H05K 5/069 |
| 9,672,870 B1 * | 6/2017 | Mizumoto | G11B 33/022 |
| 9,886,985 B1 * | 2/2018 | Okamoto | G11B 33/027 |
| 2002/0055292 A1 | 5/2002 | Maiers et al. | |
| 2004/0257698 A1 | 12/2004 | Bernett | |
| 2006/0050429 A1 | 3/2006 | Gunderson et al. | |
| 2008/0165449 A1 | 7/2008 | Shindo et al. | |
| 2008/0259503 A1 | 10/2008 | Aoyagi et al. | |
| 2008/0316641 A1 | 12/2008 | Gunderson et al. | |
| 2009/0097163 A1 | 4/2009 | Suzuki et al. | |
| 2009/0168233 A1 | 7/2009 | Kouno et al. | |
| 2009/0259265 A1 * | 10/2009 | Stevenson | A61N 1/0556 607/2 |
| 2010/0328815 A1 | 12/2010 | Nakatsuka et al. | |
| 2011/0056731 A1 * | 3/2011 | VandenEynden | H01B 17/305 174/152 GM |
| 2012/0006576 A1 * | 1/2012 | Barry | A61N 1/3754 174/50.6 |
| 2012/0052747 A1 | 3/2012 | Kataoka et al. | |
| 2012/0307416 A1 * | 12/2012 | Iyer | A61N 1/3754 361/302 |
| 2013/0050872 A1 | 2/2013 | Sekii et al. | |
| 2013/0314897 A1 | 11/2013 | Dal Ben et al. | |
| 2014/0023823 A1 | 1/2014 | Ying et al. | |
| 2014/0043739 A1 * | 2/2014 | Deininger | A61N 1/3754 361/679.01 |
| 2015/0098178 A1 | 4/2015 | Otake et al. | |
| 2015/0124352 A1 | 5/2015 | Rothenberg et al. | |
| 2015/0380851 A1 | 12/2015 | Zhao | |
| 2016/0270173 A1 | 9/2016 | Xiong | |
| 2016/0287883 A1 * | 10/2016 | Barry | A61N 1/3754 |
| 2017/0169860 A1 * | 6/2017 | Sudo | G11B 25/043 |
| 2017/0169861 A1 * | 6/2017 | Sudo | G11B 25/043 |
| 2017/0186467 A1 | 6/2017 | Akagi et al. | |
| 2017/0221527 A1 * | 8/2017 | Choe | G11B 33/1466 |

* cited by examiner

SEALED BULKHEAD ELECTRICAL FEED-THROUGH POSITIONING CONTROL

FIELD OF EMBODIMENTS

Embodiments of the invention may relate generally to data storage devices and more particularly to controlling the positioning of an electrical feed-through.

BACKGROUND

A hard-disk drive (HDD) is a non-volatile storage device that is housed in a protective enclosure and stores digitally encoded data on one or more circular disk having magnetic surfaces. When an HDD is in operation, each magnetic-recording disk is rapidly rotated by a spindle system. Data is read from and written to a magnetic-recording disk using a read-write head that is positioned over a specific location of a disk by an actuator. A read-write head uses a magnetic field to read data from and write data to the surface of a magnetic-recording disk. A write head makes use of the electricity flowing through a coil, which produces a magnetic field. Electrical pulses are sent to the write head, with different patterns of positive and negative currents. The current in the coil of the write head induces a magnetic field across the gap between the head and the magnetic disk, which in turn magnetizes a small area on the recording medium.

HDDs are being manufactured which are hermetically sealed with helium inside. Further, other gases that are lighter than air have been contemplated for use as a replacement for air in sealed HDDs. There are various benefits to sealing and operating an HDD in helium ambient, for example, because the density of helium is one-seventh that of air. For example, operating an HDD in helium reduces the drag force acting on the spinning disk stack and the mechanical power used by the disk spindle motor is substantially reduced. Further, operating in helium reduces the flutter of the disks and the suspension, allowing for disks to be placed closer together and increasing the areal density (a measure of the quantity of information bits that can be stored on a given area of disk surface) by enabling a smaller, narrower data track pitch. The lower shear forces and more efficient thermal conduction of helium also mean the HDD will run cooler and will emit less acoustic noise. The reliability of the HDDs is also increased due to low humidity, less sensitivity to altitude and external pressure variations, and the absence of corrosive gases or contaminants.

Electronic systems that require a hermetically sealed internal volume (e.g., a lighter-than-air gas filled, sealed HDD) need a way of connecting electrical lines through the enclosure. This is typically accomplished with a hermetic electrical connector, or electrical "feed-through" connector (or simply a "feed-through"). One possible approach may involve the use of a low permeability but relatively expensive feed-through, such as glass-metal feed-through. This type of feed-through typically includes straight pins on each side, and is typically soldered to the HDD base at the feed-through sidewall.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY OF EMBODIMENTS

Embodiments of the invention are generally directed at an electrical feed-through comprising at least one positioning protrusion, a data storage device comprising such a feed-through, and a method of assembling a data storage device comprising such a feed-through. The electrical feed-through may be referred to as a "printed circuit board (PCB) connector" in that it involves multiple insulating layers with electrical terminals on each side, at least some of which are interconnected by way of vias. This electrical feed-through comprises the at least one positioning protrusion protruding from a main body, and may further comprise multiple positioning protrusions protruding in respective directions from the main body.

The data storage device embodiment comprises an enclosure base with which the electrical feed-through is coupled, where the base comprises an annular recessed surface surrounding an aperture that is encompassed by the electrical feed-through and is at a first level, and at least one recessed positioning surface at a higher level than the first level and extending in a direction away from the annular recessed surface. The positioning protrusion of the electrical feed-through physically mates with the recessed positioning surface of the base, such that the position of the electrical feed-through is vertically constrained by the recessed positioning surface.

Embodiments discussed in the Summary of Embodiments section are not meant to suggest, describe, or teach all the embodiments discussed herein. Thus, embodiments of the invention may contain additional or different features than those discussed in this section. Furthermore, no limitation, element, property, feature, advantage, attribute, or the like expressed in this section, which is not expressly recited in a claim, limits the scope of any claim in any way.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Approaches to a well-positioned electrical feed-through are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of an Illustrative Operating Context

Embodiments may be used in the context of an electrical feed-through for a hard disk drive (HDD). Thus, in accordance with an embodiment, a plan view illustrating an HDD 100 is shown in FIG. 1 to illustrate an exemplary operating context.

Figure 1:
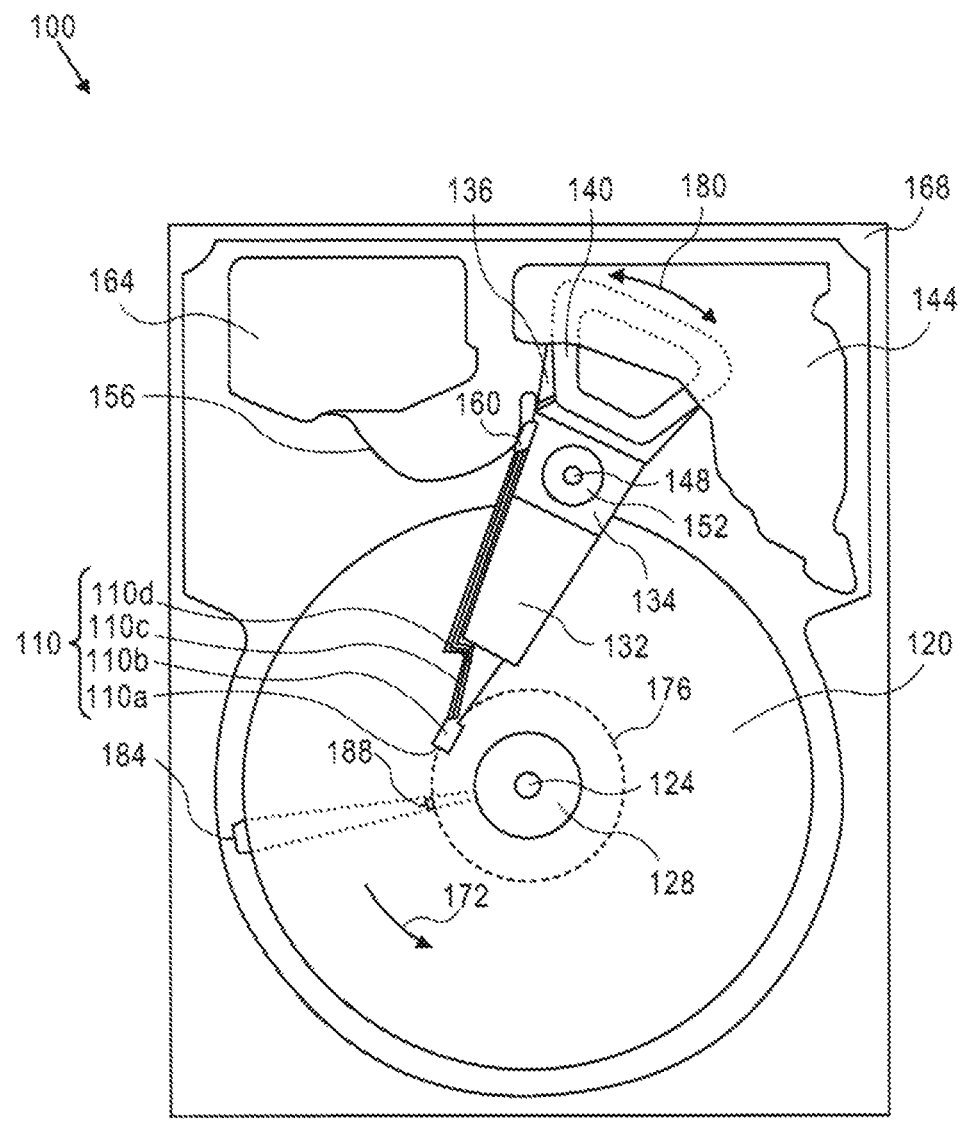
FIG. 1 is a plan view illustrating a hard disk drive (HDD), according to an embodiment.

FIG. 1 illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110a, are transmitted by a flexible cable assembly (FCA) 156 (or "flex cable"). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110a of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Introduction

The term "hermetic" will be understood to describe a sealing arrangement designed to have nominally no (or negligible) gaseous leakage or permeation paths. While terms such as "hermetic", "negligible leakage", "no leakage", etc. may be used herein, note that such a system would often still have a certain amount of permeability and, therefore, not be absolutely leak free. Hence, the concept of a desired or target "leak rate" may be referred to elsewhere herein. As discussed, electronic systems that require a hermetically sealed internal volume (e.g., a lighter-than-air gas filled, sealed HDD) need a way of connecting electrical lines through the enclosure, and there remains challenges regarding a low leakage rate versus the cost, manufacturability, and reliability of a suitable electrical feed-through.

The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees.

Figure 2:
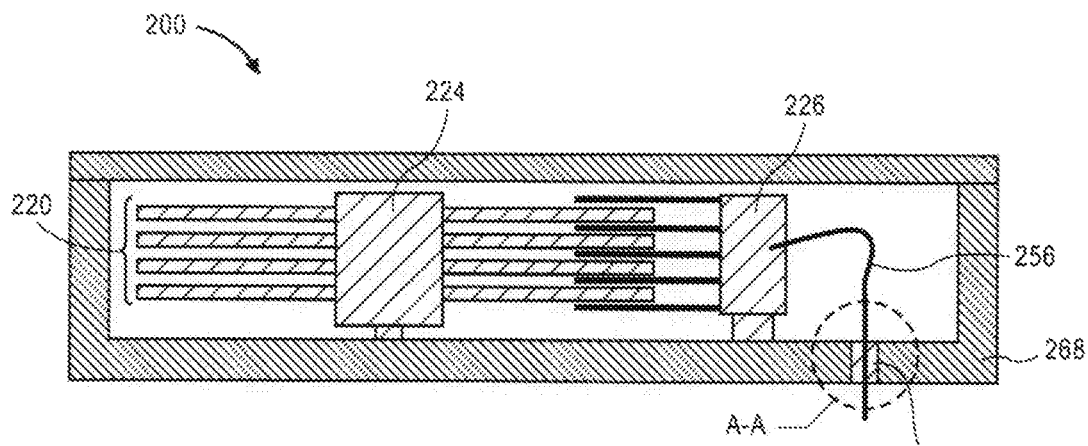
FIG. 2 is a cross-sectional side view illustrating a hard disk drive (HDD), according to an embodiment.

FIG. 2 is a cross-sectional side view illustrating a hard disk drive (HDD), according to an embodiment. For example, HDD 200 comprises at least one recording medium 220 (e.g., such as magnetic-recording medium 120 of FIG. 1) rotatably mounted on a spindle 224 (e.g., such as spindle 124 of FIG. 1) of a drive motor that drives the rotation of the recording medium 220, and a head stack assembly (HSA) 226 that carries and moves a head slider housing a read-write transducer to locations over the recording medium 220 for reading information from and writing information to the recording medium 220. HDD 200 further comprises a flexible cable assembly (FCA) 256 that electrically connects the HSA 226 to an electronic component external to the hermetically-sealed internal environment of HDD 200, such as to a printed circuit board (e.g., an "SOC", or system-on-a-chip) that may be coupled to the HDD 200. In so doing, the FCA 256 is routed through an interface 250 (e.g., mechanical and/or electrical), which includes a small opening, which is associated with an HDD enclosure base 268 (e.g., similar to a hermetically-sealed version of housing 168 of FIG. 1). FIG. 2 further illustrates an area A-A near and including the interface 250, which is referenced elsewhere herein.

As mentioned, in the context of a sealed hard disk drive, a hermetic electrical connector may be used to electrically connect (e.g., an internal flexible cable with an external onboard printed circuit board assembly), where one approach may involve the use of a low permeability but relatively expensive feed-through (e.g., a glass-metal feed-through), typically soldered to the HDD base at the feed-through sidewall. Alternatively, a printed circuit board-based (or "PCB-based) sealed bulkhead ("SBH") connector (or "feed-through") may be used, whereby an SBH connector may be attached to the base by soldering or adhesive affixing. An SBH feed-through is referred to herein as a PCB-based feed-through because it is typically fabricated using materials and processes generally associated with PCBs. One advantage of using PCB-based components, generally, and a PCB-based electrical feed-through, specifically, is the relatively low cost associated with a now mature fabrication approach.

With respect to an SBH connector, the sidewall is not useful for soldering because the SBH connector is a PCB and a solder pattern cannot practically be made on the PCB sidewall. Hence, solder or adhesive is typically applied between the bottom of the SBH connector and a base surface. With such a structure, the SBH connector height varies relative to the solder or adhesive thickness. Furthermore, more stringent height requirements may be associated with an SBH connector than with a glass-metal feed-through connector because a compression-type connector, which uses compression-type contact pins, may be used for electrical contacts between the SBH connector and each of the flex cable and the onboard PCB assembly. Thus, the respective distance between the SBH connector and each of the flex cable and the PCB assembly should be held within a specified range suitable for the compression-type pins. Therefore, SBH connector height control is desirable.

Figure 3A:
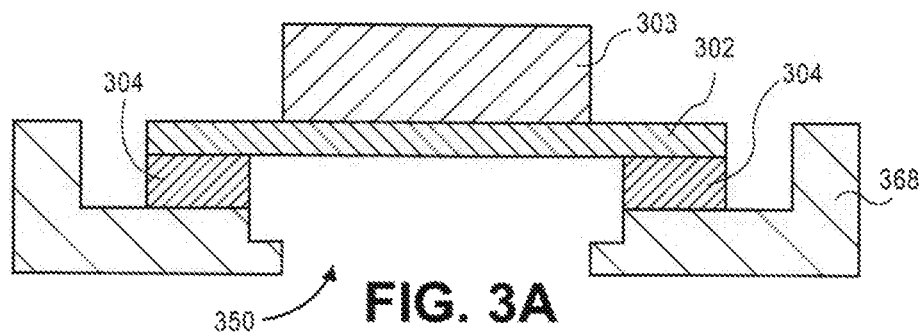
FIGS. 3A, 3B, 3C are cross-sectional side view diagrams illustrating a respective electrical feed-through connector-to-base interface.
Figure 3B:
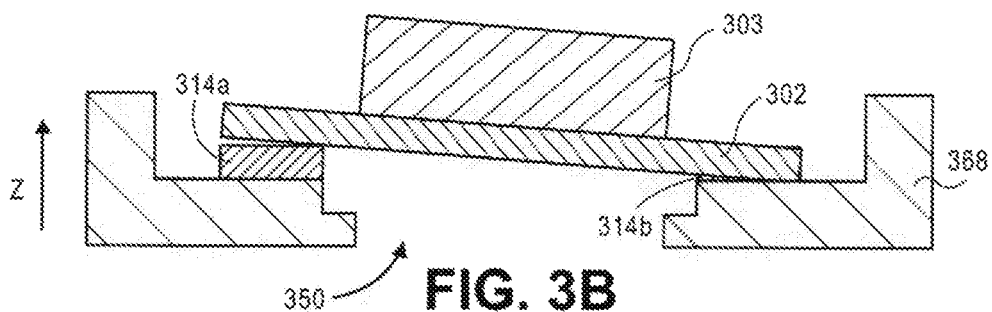
Figure 3C:
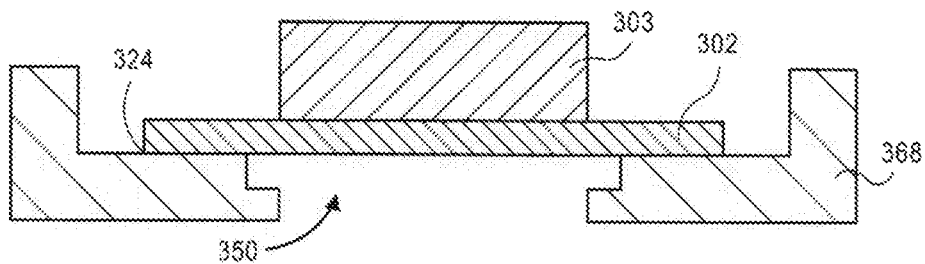

FIGS. 3A, 3B, 3C are cross-sectional side view diagrams illustrating a respective sealed bulkhead connector-to-base interface. Each of FIGS. 3A, 3B, 3C illustrates an assembly problem that may occur without implementation of inventive embodiments described herein. FIG. 3A depicts a scenario in which a sealed bulkhead (SBH) electrical feed-through 302, with a compression-type connector 303 affixed thereto, is adhered to an enclosure base 368 at an interface 350 by way of an adhesive 304. Without the z-direction height control provided by implementation of the electrical feed-through positioning protrusion(s) (e.g., positioning protrusion 404a of FIG. 4) and the matching base recessed positioning surface(s) (e.g., recessed positioning surface 504a of FIG. 5), the adhesive 304 may be too thick for a suitable leak rate through the interface 350. Additionally, with reference to FIG. 3B, without the z-direction height control provided by implementation of the electrical feed-through positioning protrusion(s) (e.g., positioning protrusion 404a) and the matching base recessed positioning surface(s) (e.g., recessed positioning surface 504a), the adhesive 314a, 314b may cause the SBH feed-through 302 to tilt and, again, cause a scenario in which there is an unsuitable leak rate through the interface 350. With reference now to FIG. 3C, without the z-direction height control provided by implementation of the electrical feed-through positioning protrusion(s) (e.g., positioning protrusion 404a) and the matching base recessed positioning surface(s) (e.g., recessed positioning surface 504a), the adhesive 324 may be too thin (or even absent) for a suitable leak rate through the interface 350.

Electrical Feed-Through with Positioning Protrusion

Figure 4:
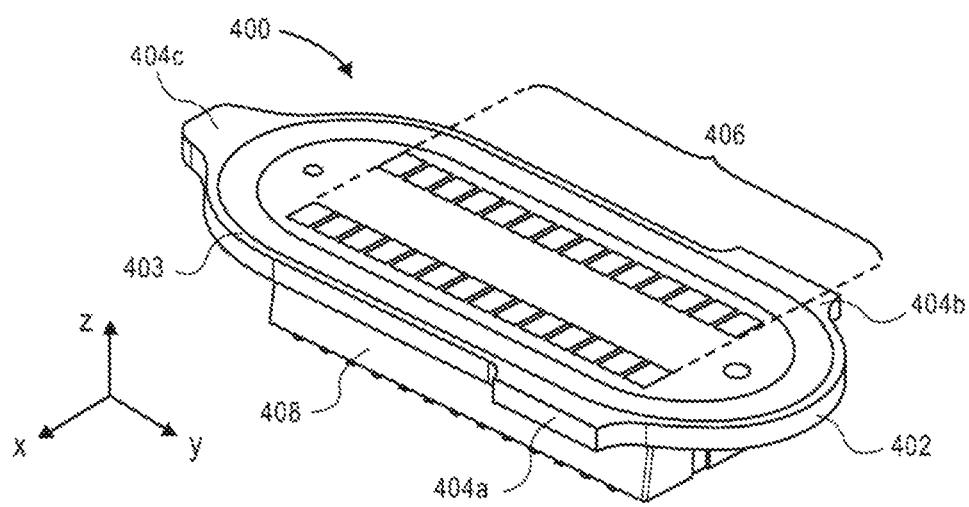
FIG. 4 is a perspective view of a sealed bulkhead electrical feed-through connector, according to an embodiment.

FIG. 4 is a perspective view of a sealed bulkhead electrical feed-through connector, according to an embodiment. Electrical feed-through 400 connector (hereinafter, "feed-through 400") may be referred to as a PCB (printed circuit board) based feed-through, fabricated using materials and processes generally associated with PCBs.

A PCB-based electrical feed-through such as feed-through 400 may comprise a laminate structure having one or more layers 402 of insulating material (e.g., FR-4 glass-reinforced epoxy, or plastic laminate), having a main body 403 and at least one positioning protrusion, such as any one or more positioning protrusion 404a, 404b, 404c (collectively, "positioning protrusion 404"), protruding from the main body 403. Additionally, feed-through 400 comprises a plurality of electrical terminals 406 (sometimes referred to generally as "electrical pads" or "electrical connections") on each of the top and bottom sides of the feed-through 400. The main body 403 encompasses the plurality of electrical terminals 406, where at least some of the electrical terminals 406 on the top and bottom sides are electrically interconnected by way of a respective via through the main body 403.

According to an embodiment, the electrical terminals 406, at least on one of the top or bottom side of the feed-through 400, comprise solder pads. According to an embodiment, the electrical terminals 406 on both the top and bottom sides of the feed-through 400 comprise solder pads. According to an embodiment, the feed-through 400 further comprises a connector part 408, having spring terminals (also referred to as "compression-type terminals" or "compression-type pins"), where the connector part 408 is electrically coupled and connected to the electrical terminals 406 on at least on one side of the feed-through 400. According to an embodiment, connector part 408 comprises a compression-type connector, a style of connector that can be used to electrically connect to and communicate with a PCB.

The number of electrical terminals 406 constituent to an electrical feed-through such as feed-through 400 may vary from implementation to implementation. Thus, the number of electrical terminals 406 illustrated in FIG. 4 is for purposes of example only. Note also that an electrical feed-through such as feed-through 400 need not be shaped precisely as depicted in FIG. 4, but may vary from implementation to implementation based on, for example, the shape of the interface (e.g., interface 250 of FIG. 2) and the corresponding aperture of the base (e.g., aperture 502 of FIG. 5).

According to an embodiment, feed-through 400 comprises a first positioning protrusion 404a protruding from the main body 403 in a first direction. For example, positioning protrusion 404a protrudes from main body 403 in the x-direction.

According to an embodiment, feed-through 400 comprises a second positioning protrusion 404b protruding from the main body 403 in a direction opposing the first direction. For example, positioning protrusion 404b protrudes from main body 403 in a direction opposing the x-direction (i.e., negative x-direction).

According to an embodiment, feed-through 400 comprises a third positioning protrusion 404c protruding from the main body 403 in a direction substantially normal to the first direction. For example, positioning protrusion 404c protrudes from main body 403 in the y-direction (or negative y-direction).

However, the number and location of positioning protrusions 404 constituent to an electrical feed-through such as feed-through 400 may vary from implementation to implementation, while still falling within the scope of embodiments contemplated.

Electrical Feed-Through with Positioning Protrusions, Assembled with Base

Figure 5:
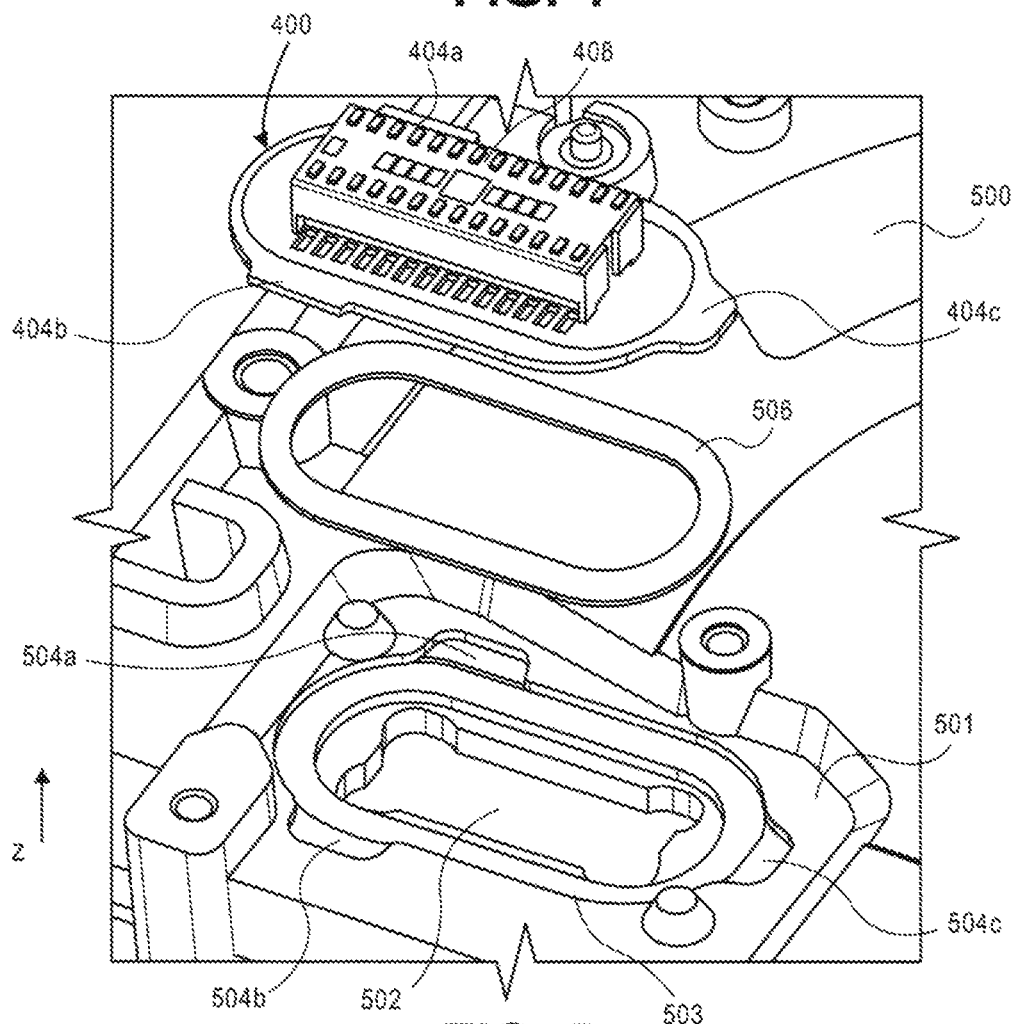
FIG. 5 is an exploded perspective view of a sealed bulkhead electrical feed-through connector and base, according to an embodiment.

FIG. 5 is an exploded perspective view of a sealed bulkhead electrical feed-through connector and a base, according to an embodiment. The assembly depicted exploded in FIG. 5 includes the SBH feed-through 400 exploded from enclosure base 500 (e.g., base 268 of FIG. 2), and will be described as if the feed-through 400 is assembled with the base 500. Note that the feed-through 400 is depicted in a position opposite from how feed-through 400 is depicted in FIG. 4 (e.g., upside down).

According to an embodiment, base 500 comprises an aperture 502 encompassed by the feed-through 400, an annular recessed surface 503 surrounding the aperture, and at least one recessed positioning surface 504a, 504b, and/or 504c (collectively, recessed positioning surface 504) extending in a direction(s) away from the annular recessed surface 503. According to an embodiment, there are as many recessed positioning surfaces 504 on base 500 as there are positioning protrusions 404 on feed-through 400.

As shown, each of the annular recessed surface 503 and the recessed positioning surface 504 are recessed from a surrounding surface 501. According to an embodiment, the base 500 structure surrounding the aperture 502 is a stepped structure, in which the annular recessed surface 503 is at one level or plane and the recessed positioning surface 504 is at a second level, which is at a higher level or plane than the level of the annular recessed surface 503, both of which are recessed from the surrounding surface 501. As can be envisioned from FIG. 5, each positioning protrusion 404a, 404b, and/or 404c is intended to physically mate with a corresponding recessed positioning surface 504a, 504b, and/or 504c, respectively, in order to vertically constrain the positioning of the feed-through 400 relative to the base 500.

According to an embodiment, feed-through 400 comprises a first positioning protrusion protruding in a first direction, such as positioning protrusion 404a, and the base 500 comprises a corresponding first recessed positioning surface extending in the first direction, such as recessed positioning surface 504a, whereby the corresponding positioning structures are configured to physically mate to vertically constrain the position of feed-through 400 relative to base 500 in an assembled state.

According to an embodiment, feed-through 400 further comprises a second positioning protrusion protruding in a direction opposing the first direction, such as positioning protrusion 404b, and the base 500 comprises a corresponding second recessed positioning surface extending in a direction opposing the first direction, such as recessed positioning surface 504b, whereby the corresponding positioning structures (e.g., first positioning protrusion 404a with first recessed positioning surface 504a, and second positioning protrusion 404b with second recessed positioning surface 504b) are configured to physically mate to vertically constrain the position of feed-through 400 relative to base 500 in an assembled state.

According to an embodiment, feed-through 400 further comprises a third positioning protrusion protruding in a direction substantially normal to the first direction, such as positioning protrusion 404c, and the base 500 comprises a corresponding third recessed positioning surface extending in a direction substantially normal to the first direction, such as recessed positioning surface 504c, whereby the corresponding positioning structures (e.g., first positioning protrusion 404a with first recessed positioning surface 504a, second positioning protrusion 404b with second recessed positioning surface 504b, and third positioning protrusion 404c with third recessed positioning surface 504c) are configured to physically mate to vertically constrain the position of feed-through 400 relative to base 500 in an assembled state.

Note that the precise number, shape, and location of the positioning protrusions 404 of feed-through 400, and the corresponding recessed positioning surfaces 504 of base 500, may vary from implementation to implementation based, for example, on surrounding structural constraints, and the like.

The assembly depicted in the exploded view of FIG. 5 further comprises, according to an embodiment, an adhesive 506 (or adhesive ring) that is positioned between the annular recessed surface 503 and the feed-through 400, which functions to affix the feed-through 400 to the base 500. According to an embodiment, the adhesive 506 comprises a preformed solder. However, other types of materials may be used to affix the feed-through 400 to the base 500, such as an epoxy adhesive, or a heat-seal material, and the like.

Figure 6:
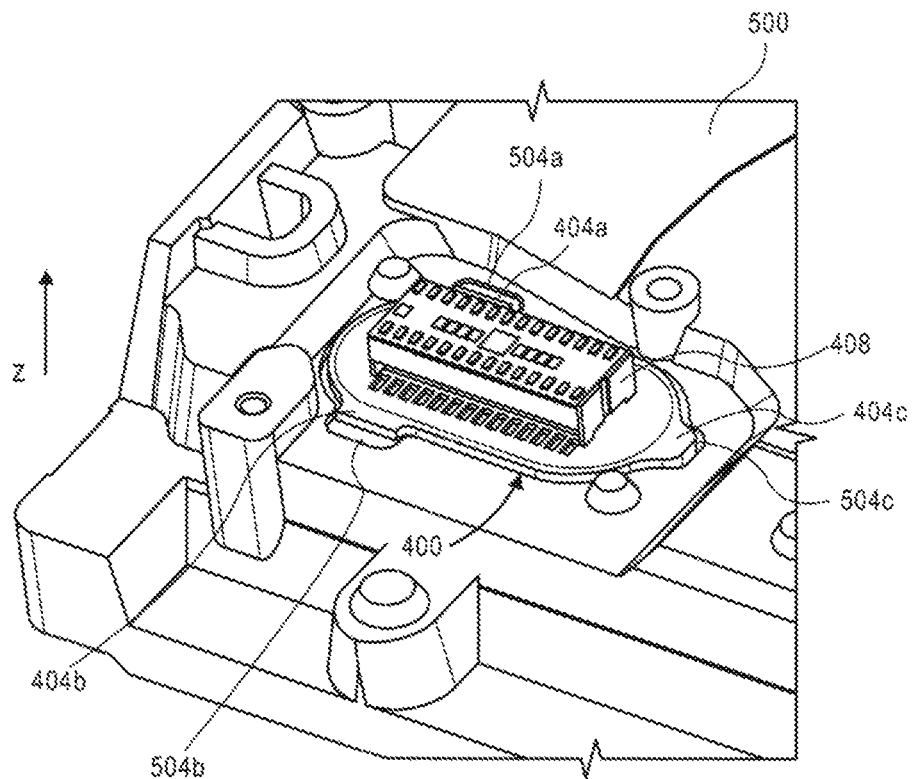
FIG. 6 is a perspective view of the sealed bulkhead electrical feed-through connector as assembled with the base, according to an embodiment.

FIG. 6 is a perspective view of the sealed bulkhead electrical feed-through connector as assembled with the base, according to an embodiment. The assembly depicted in FIG. 6 includes the SBH feed-through 400 seated with and coupled, adhered, affixed to the inside of an enclosure base 500. As described, according to an embodiment, there are as many recessed positioning surfaces 504 on base 500 as there are positioning protrusions 404 on feed-through 400, because each positioning protrusion 404 is intended to physically mate with a corresponding recessed positioning surface 504, in order to vertically constrain the positioning of the feed-through 400.

Figure 7:
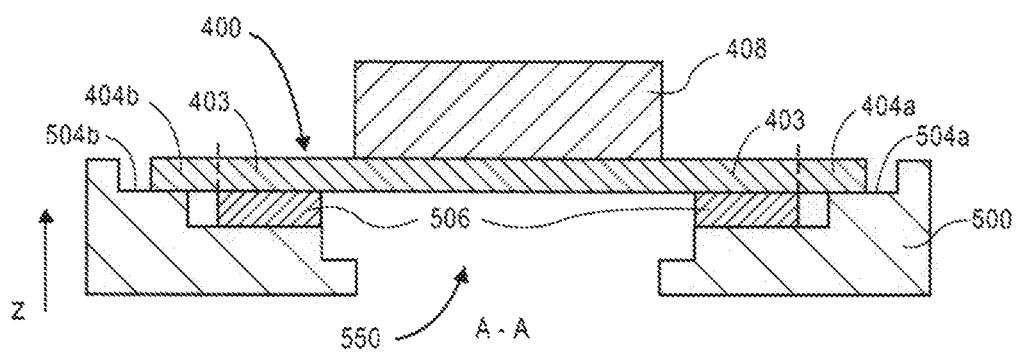
FIG. 7 is a cross-sectional side view diagram illustrating a sealed bulkhead electrical feed-through connector-to-base interface, according to an embodiment.

FIG. 7 is a cross-sectional side view diagram illustrating a sealed bulkhead electrical feed-through connector-to-base interface, according to an embodiment. With reference back to area A-A of FIG. 2, FIG. 7 depicts a scenario in which a sealed bulkhead (SBH) feed-through 400, with a compression-type connector 408 affixed thereto, is adhered to an enclosure base 500 at an interface 550 by way of an adhesive 506. With a comparison to the scenarios depicted in FIGS. 3A-3C, here the z-direction height control provided by implementation of the electrical feed-through 400 positioning protrusion(s) 404 (positioning protrusions 404a, 404b shown), and the corresponding base 500 recessed positioning surface(s) 504 (recessed positioning surfaces 504a, 504b shown), the adhesive 506 can provide for a suitable leak rate through the interface 550.

One possible implementation of a SBH electrical feed-through such a feed-through 400 may be for use with a sealed hard disk drive that includes a hermetically sealed gas-filled (e.g., a lighter-than-air type gas, such as helium, nitrogen, etc., for non-limiting examples) enclosure that has an opening extending through an HDD base 500 (e.g., similar to a hermetically-sealed version of housing 168 of FIG. 1). In such an implementation, an electrical connector may be disposed inside the enclosure and adjacent to the opening, and which can be electrically connected to an electrical feed-through, such as feed-through 400, which spans the opening. For example, an electrical connector may be electrically connected with an internal HDD flexible interconnect cable (e.g., flex cable 156 of FIG. 1, flexible cable assembly 256 of FIG. 2), and with the feed-through 400 by way of electrical terminals 406. Alternatively, an internal HDD flexible interconnect cable may be directly connected with the feed-through 400 by way of electrical terminals 406. Broadly, feed-through 400 may facilitate electrical contact and connection between the outside and inside of the hermetically sealed cavity/enclosure. Thus, according to an embodiment, the structural configuration depicted in FIGS. 6 and 7 is implemented in a data storage device (e.g., an HDD) having a hermetically-sealed enclosure, in which a lighter-than-air gas is contained.

A potential, non-limiting, benefit envisioned by the foregoing mating structures (i.e., positioning protrusion 404 of SBH feed-through 400 and corresponding recessed positioning surface 504 of base 500) relates to manufacturing tolerance control, whereby because the recessed positioning surfaces 504 of base 500 may be formed by a machining process, the height tolerance can be small and relatively well-controlled. Hence, the feed-through 400 z-direction positioning after affixation to the base 500 is likewise well-controlled and within small tolerances. Furthermore, for example, by controlling the z-direction positioning of the feed-through 400 precisely, the height of the connector part 408 (and the compression-type terminals, in the case of a compression-type connector) can be controlled within specified values and, therefore, the quality of the associated electrical connection can be maintained reliably. Still further, for example, the thickness of the adhesive 506 may also be well-controlled by the foregoing structural configurations. Thus, because the adhesive 506 may function both to affix the feed-through 400 to the base 500 with sufficient strength, and to seal a lighter-than-air gas (e.g., helium) inside in the case of a hermetically-sealed device, a suitable leak rate may be maintained through the interface (e.g., interface 250 of FIG. 2, at area A-A) and a corresponding low-permeable adhesive 506 by controlling the thickness of the adhesive 506 (i.e., by maintaining a relatively thin adhesive 506).

Method of Assembling a Data Storage Device

Figure 8:
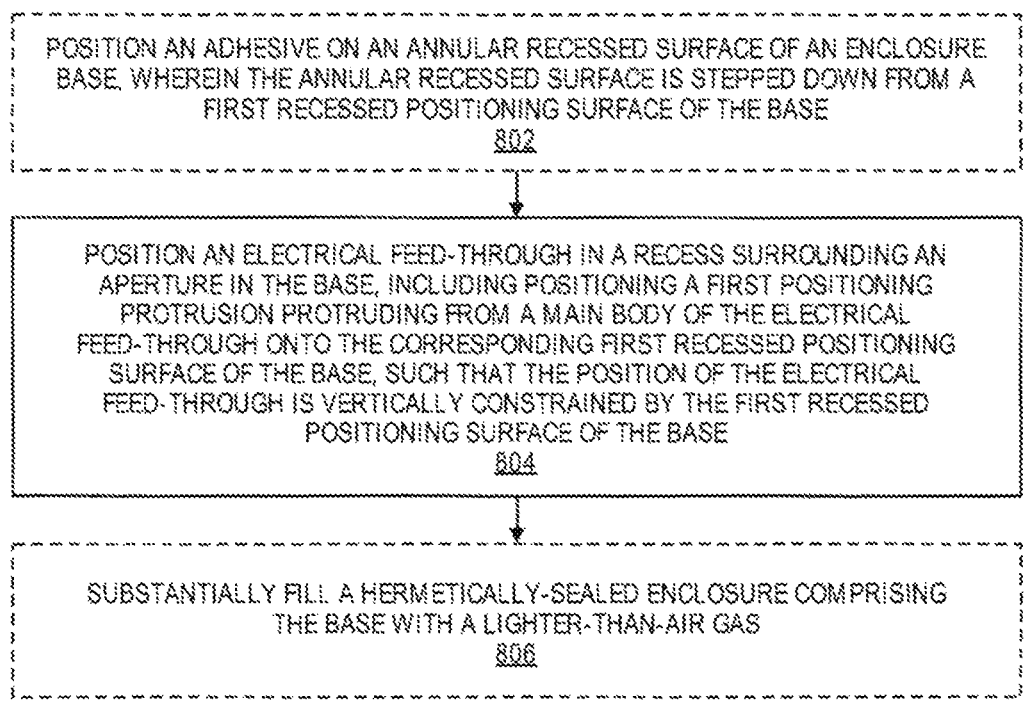
FIG. 8 is a flow diagram illustrating a method of assembling a data storage device, according to an embodiment.

FIG. 8 is a flow diagram illustrating a method of assembling a data storage device, according to an embodiment.

At an optional block 802 (depicted as optional with a dashed block), according to an embodiment, an adhesive is positioned on an annular recessed surface of an enclosure base, wherein the annular recessed surface is stepped down from a first recessed positioning surface of the base. For example, adhesive 506 (FIG. 5), such as a preformed solder ring, is positioned on annular recessed surface 503 (FIG. 5) of enclosure base 500 (FIGS. 5, 6), wherein the annular recessed surface 503 is stepped down from (i.e., lower than) the recessed positioning surfaces 504a, 504b, 504c (FIG. 5).

At block 804, an electrical feed-through is positioned in a recess surrounding an aperture in the base, including positioning a first positioning protrusion protruding from a main body of the electrical feed-through onto the corresponding first recessed positioning surface of the base, such that the position of the electrical feed-through is vertically constrained by the first recessed positioning surface of the base. For example, electrical feed-through 400 (FIGS. 4-7) is positioned in a recess surrounding an aperture 502 (FIG. 5) in the base 500, including positioning a first positioning protrusion 404a (FIGS. 4-7) protruding from a main body 403 (FIG. 4) of the electrical feed-through 400 onto the corresponding first recessed positioning surface 504a of the base 500, such that the position of the electrical feed-through 400 is vertically constrained by the first recessed positioning surface 504a of the base 500. In the context of optional block 802, the electrical feed-through 400 would be positioned, at block 804, onto the adhesive 506 positioned at block 802. Furthermore, in the context of a preformed solder adhesive 506, according to an embodiment, the solder is reflowed by heating the feed-through 400 and the base 500.

According to an embodiment, the electrical feed-through 400 is configured to interface between a hermetically-sealed environment and an external environment. For example, the hermetically-sealed environment may be the internal cavity of a sealed hard disk drive having a lighter-than-air gas largely sealed therein. At optional block 806 (depicted as optional with a dashed block), according to an embodiment, a hermetically-sealed enclosure comprising the base is substantially filled with a lighter-than-air gas. For example, a hermetically-sealed HDD such as HDD 200 (FIG. 2) is fabricated having the feed-through 400 and base 500 as described herein, and is filled with a lighter-than air gas such as helium.

EXTENSIONS AND ALTERNATIVES

Implementation and use of embodiments described herein are not limited solely to individual data storage devices or HDDs. Rather, embodiments involving the use of an electrical feed-through to enclosure base interface as described to provide a well-positioned and controlled hermetic interface seal, may also be applied to a system level sealed tray or box of multiple HDDs enclosed in a box containing gas like He or $N_2$, as well as to hermetically-sealed electronic devices, generally (e.g., optical systems, optical data storage devices, and the like).

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. An electrical feed-through comprising:
   a wall defining an outer boundary of the electrical feed-through;
   a main body;
   one or more layers of insulating material positioned in the main body;
   a first positioning protrusion extending from the wall in a first direction and extending beyond the wall, the first positioning protrusion configured to be received in a first recess of an enclosure base;
   a second positioning protrusion extending from the wall in a second direction different from the first direction, the second positioning protrusion configured to be received in a second recess of the enclosure base;
   a plurality of first electrical terminals positioned on a first side of said main body;
   a plurality of second electrical terminals positioned on a second side of said main body, the second side being opposite the first side; and
   a plurality of vias electrically connecting at least some of said first electrical terminals with corresponding said second electrical terminals through said main body.

2. The electrical feed-through of claim 1, wherein the second direction is opposite the first direction.

3. The electrical feed-through of claim 1, wherein the second direction is normal to the first direction.

4. The electrical feed-through of claim 1, further comprising a third positioning protrusion extending from the wall in a third direction different from the first and second directions, the third positioning protrusion configured to be received in a third recess of the enclosure base.

5. The electrical feed-through of claim 4, wherein the first, second, and third positioning protrusions are further configured to physically mate with surfaces of the first, second, and third recesses of the enclosure base, respectively, such that position of the main body is vertically constrained by the surfaces of the first, second, and third recesses.

6. The electrical feed-through of claim 4, wherein the second direction is normal to the first direction, and wherein the third direction is opposite the second direction.

7. The electrical feed-through of claim 1, wherein the first and second positioning protrusions are further configured to physically mate with surfaces of the first and second recesses of the enclosure base, respectively, such that position of the main body is vertically constrained by the surfaces of the first and second recesses.

8. The electrical feed-through of claim 1, wherein a shape of the electrical feed-through is asymmetrical with respect to a central axis of the electrical feed-through perpendicular to the first direction of the first positioning protrusion.

9. A data storage device comprising the electrical feed-through of claim 1.

10. The electrical feed-through of claim 1, wherein said plurality of first and said second electrical terminals comprise solder pads.

11. The electrical feed-through of claim 1, further comprising:
    a connector including compression-type terminals electrically coupled with said plurality of first electrical terminals.

* * * * *